(12) United States Patent
Fazakas

(10) Patent No.: US 6,628,125 B1
(45) Date of Patent: Sep. 30, 2003

(54) METHOD AND APPARATUS FOR DETECTING SLOW AND SMALL CHANGES OF ELECTRICAL SIGNALS INCLUDING THE SIGN OF THE CHANGES, AND CIRCUIT ARRANGEMENT FOR THE EXACT DETECTION OF THE PEAK VALUE OF AN ALTERNATING VOLTAGE

(76) Inventor: András Fazakas, H-1068 Budapest, Benczúr u. 39/b, Budapest (HU), 1068

( * ) Notice: Subject to any disclaimer, the term of this patent is extended or adjusted under 35 U.S.C. 154(b) by 42 days.

(21) Appl. No.: 10/031,106

(22) PCT Filed: Jul. 3, 2000

(86) PCT No.: PCT/HU00/00071

§ 371 (c)(1),
(2), (4) Date: Jan. 10, 2002

(87) PCT Pub. No.: WO01/06267

PCT Pub. Date: Jan. 25, 2001

(30) Foreign Application Priority Data

Jul. 15, 1999 (HU) .............................................. 9902384

(51) Int. Cl.[7] .............................................. G01R 27/26
(52) U.S. Cl. ...................................... 324/678; 324/433
(58) Field of Search ................................ 324/678, 676, 324/677, 710, 711, 432, 433; 320/127, 166, 152, 148

(56) References Cited

U.S. PATENT DOCUMENTS

| | | | | |
|---|---|---|---|---|
| 3,900,785 A | * | 8/1975 | Alric et al. ................... | 320/39 |
| 4,137,493 A | | 1/1979 | Smith | |
| 5,572,136 A | * | 11/1996 | Champlin ................... | 324/426 |
| 5,862,515 A | * | 1/1999 | Kobayashi et al. .......... | 702/63 |

FOREIGN PATENT DOCUMENTS

| | | |
|---|---|---|
| DE | 101988 | 11/1973 |
| DE | 4446535 | 6/1996 |
| GB | 2332283 | 6/1999 |
| WO | WO9914612 | 3/1999 |

OTHER PUBLICATIONS

Patent Abstracts of Japan; vol. 015, No. 184 (P–1200); May 13, 1991; JP 03 042577 A (Advantest Corp).
F.A. Bamberg: "Stoss spanungsmess geräte" Elektrotechnische Zeitschrift, vol. 23b, No. 13, Jun. 1971, pp. 305–306, XP002154262.
PCT/HU00/00071 International Search Report dated Dec. 18, 2000.

* cited by examiner

Primary Examiner—N. Le
Assistant Examiner—Amy He
(74) Attorney, Agent, or Firm—Handal & Morofsky

(57) ABSTRACT

Apparatus for detecting slow and small changes of electrical signals including the sign of the changes, the apparatus includes: a controlled switch (2); a capacitor (3) charged to the voltage of a signal to be detected; an amplifier (5) for generating a pulse signal corresponding to the charge or discharge current of the capacitor (3) having corresponding proper sign; a window comparator (7) for indicating whether the output signal of the amplifier (5) lies in the range defined by the window or it has been crossed in negative or positive directions; storage and logic units each having first and second storage devices (8, 11); a pulse generator (9) connected to the controlled switch (2) to make.it closed for periodically repeated sampling periods; a first storage device storing the logical state of the window comparator (7) with proper sign, and a predetermined section of each pulse of the pulse generator reading such stored values of the first storage device into a second storaged device.

9 Claims, 3 Drawing Sheets

METHOD AND APPARATUS FOR DETECTING SLOW AND SMALL CHANGES OF ELECTRICAL SIGNALS INCLUDING THE SIGN OF THE CHANGES, AND CIRCUIT ARRANGEMENT FOR THE EXACT DETECTION OF THE PEAK VALUE OF AN ALTERNATING VOLTAGE

The invention relates to a method and apparatus for detecting slow and small changes of electrical signals including the sign of the changes, and circuit arrangement for the exact detection of the peak value of an alternating voltage. Under the term "electrical signals" a direct current voltage or quantities that can be represented by the measurement of direct current voltages are understood, such quantities are e.g. output signals of current or temperature probes.

Direct current voltages can generally be measured with a required accuracy. There are, however, special tasks of measurements, wherein changes should be exactly detected, which are very low relative to the level of the direct current voltage, e.g. $10^{-3}$ or $10^{-4}$ times of the DC level, and such changes take place slowly, e.g. during a couple of hours. The difficulty of the task increases if the occurrence of such slow changes should be detected very fast that means less than a couple of minutes, and the detection time might be in the order of magnitude of 10 seconds. In case of such detection tasks conventional methods of measuring voltages cannot be used, since the useful signal is not higher than the accuracy of the measurements.

Typically such a task is the determination of the end of charge moment in case of charging batteries. Especially, when the battery is charged intensively with a high charging current, the charging process should be finished as soon as the fully charged state has been reached, otherwise the battery might suffer an irreversible damage. The end of charge state is often indicated by a very low change of the battery voltage which can be below 1 mV, or such an indication can be the end of a similarly low decrease of the battery voltage.

In the booklet of Motorola Inc. SG 73/D Rev. 17, 1998 of the Master Selection Guide series, an integrated battery charger circuit type MC 33340P is described that can detect the decrease of the battery voltage by a sensitivity of 4 mV. The required accuracy is much higher than this value, and it is not sufficient to detect the decrease of the voltage only, one has to determine the tendency of the change as well. The tendency means the determination whether the signal has decreased by a predetermined extent, it has increased at least by that extent or it has remained unchanged i.e. the fluctuations have not exceeded the predetermined level.

U.S. Pat. No. 4,137,493 describes a detector circuit for detecting changes in the level of a DC voltage used for controlling the end of charge moment of a battery charger. In this detector a capacitor is charged in sampling periods to the DC voltage, and in each sampling period if the DC voltage level has changed since the previous period, a charging or discharging current will flow through the lead out wire of the capacitor until it takes the new DC value. This transient current is monitored and compared with a reference voltage. The accuracy of this detector is limited by the non-compensated DC offset of the applied circuitry.

In case of very small changes of voltage signals there is no kind of reliable and accurate means available that would be able to detect the steepness of the changes or the persistence of an unchanged state of the signal. The knowledge of such parameters would be, however, desirable in several fields of the technique.

In case if the signal to be monitored is not constituted by a direct current voltage but by a quantity that is repeated periodically like pulses, then the detection problem will be more difficult, since no peak detector is known that could generate a direct current level from the pulsating electrical signal with the required accuracy. The non-linear components used for the detection have temperature-dependent properties which often fluctuate, and the direct current signal processing has both offset and drift errors. These side effects will not be negligible any more if such changes of the signal have to be determined, which are by orders of magnitude below the signal level.

A peak detector is described in DD patent 101 988, wherein the input AC voltage is rectified and filtered. This DC voltage is then sampled and a capacitor is charged. The sampling pulses are generated by forming the first and second quotient signal of the rectified voltage, and the circuit is capable of detecting a single maximum at a time. The accuracy is decreased by the short nature of the sampling pulses and by the fact that the rectified voltage has a substantial DC component that makes processing difficult.

The object of the invention is to provide a method and an apparatus that makes possible both the safe detection of the slow and small changes of a direct current voltage and the determination of the tendency of the changes, wherein the changes are by three decimal orders of magnitude smaller than the DC level, and which has a circuit design that facilitates mass production.

A further object of the invention is to provide a circuit arrangement that can carry out the peak detection of repetitive pulse signals without any fluctuation of the DC level and which has the required accuracy.

These objects have been met by the solution as defined in the attached claims.

The invention will now be described in connection with preferable embodiments thereof, wherein reference will be made to the accompanying drawings. In the drawing.

Figures 1, 2:
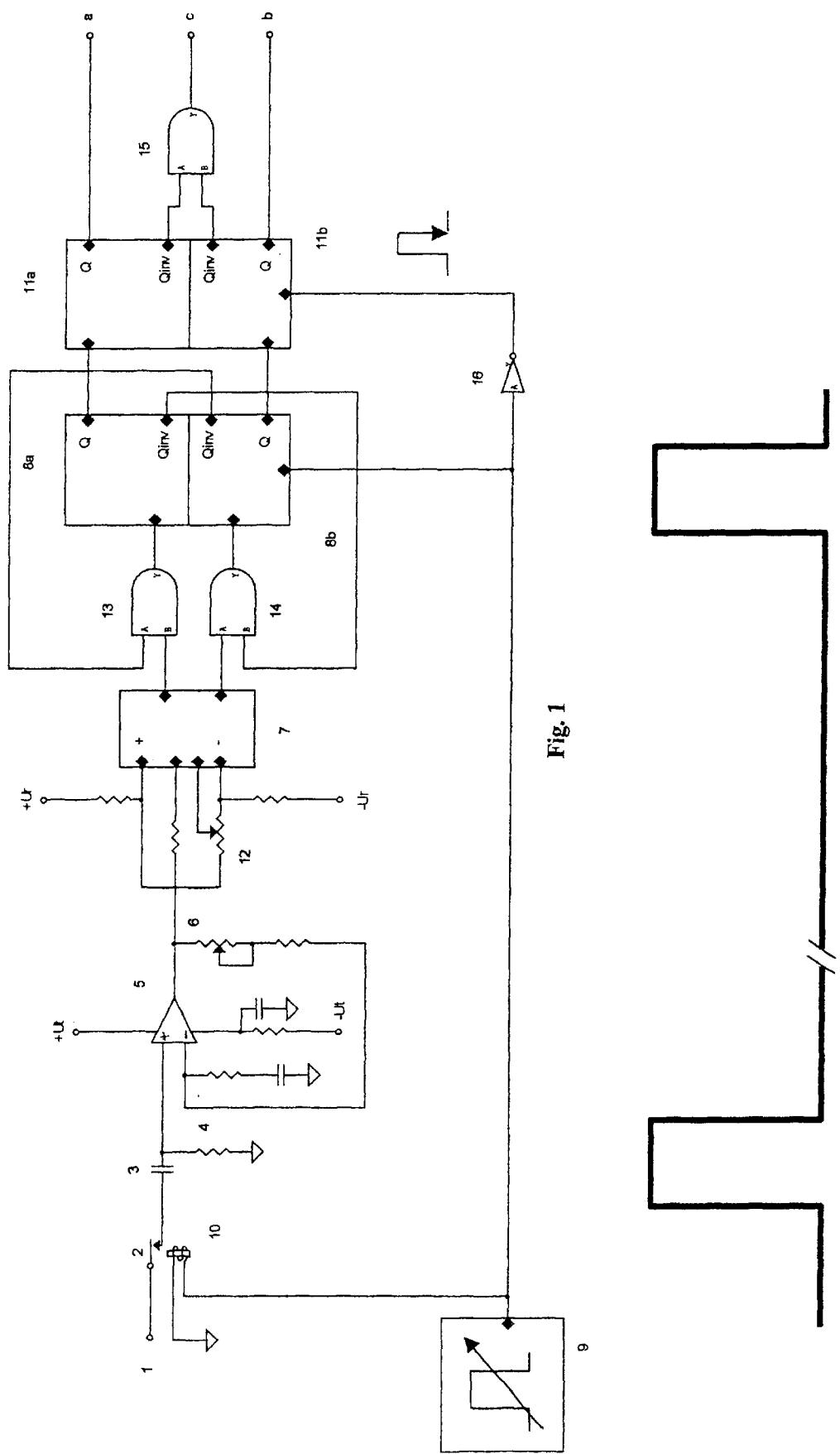
FIG. 1 is a simplified circuit diagram of an exemplary embodiment of the detection circuit according to the invention.
FIG. 2 shows the forms of the pulses of the pulse generator 9.

In the circuit shown in FIG. 1 the signal to be monitored is a direct current voltage, and its line is coupled to input terminal 1. A controlled switch 2, realized by a contact of relay 10 or by a high quality electronic switch, is connected in series with the input terminal 1. The other wire of the switch 2 is connected to an arm of a capacitor 3 of precision design, and the other arm is connected to resistor 4 and to positive input of a controlled amplifier 5 that comprises a feedback loop. The output of the controlled amplifier 5 is coupled through a branch to its own negative input, whereas the branch comprises a potentiometer 6 and an RC member, also connected to the negative input. The potentiometer 6 is adapted for adjusting the amplification. When a short unipolar voltage pulse is coupled to the positive input of the controlled amplifier 5 and it decays, under the effect of the feedback a half-wave pulse will appear at the output that has an inverse phase relative to the pulse at the input.

The output of the controlled amplifier 5 is connected to signal input of a window comparator 7. The width of the window for comparison can be adjusted, two stabilized voltages $+U_R$ and $-U_R$ are used for this purpose, and their level can be changed by circuits not shown in FIG. 1. A potentiometer 12 is used to adjust the DC window to be symmetric relative to the DC level at the signal input. The window comparator 7 has two outputs, of which signal will appear on the one, that lies in the direction where the signal voltage has crossed the adjusted voltage limit. The outputs of the window comparator 7 are coupled through respective AND gates 13 and 14 to write inputs of respective bistables 8a and 8b. The second inputs of the AND gates 13, 14 are coupled to the inverted output of the other one of the bistables 8b and 8a, and the use of these gates has a stabilizing effect on the operation.

The common enable input of the bistables 8a and 8b is coupled to output of a pulse generator 9, and this output controls additionally both the relay 10 that has the switch 2 and through an inverter 16 dynamic input of two further bistables 11a and 11b. Write inputs of the bistables 11a and 11b are connected to outputs Q of the two first bistables 8a and 8b. Outputs Q of the two second bistables 11a and 11b constitute outputs a and b of the apparatus. A third output c is connected to output of an AND gate 15 that has inputs coupled to inverted outputs of the second bistables 11a and 11b.

The operation of the voltage detection apparatus according to the invention is as follows:

The monitored device, e.g. a battery is coupled directly to the input terminal 1. The pulse generator 9 generates pulses with predetermined repetition frequency and with given duration. In the exemplary embodiment the duration of the pulses is between about 100 and 500 msec, and the period time of the pulses can be adjusted between about 1 sec and 3 minutes. FIG. 2 shows the shape of the pulses of the pulse generator 9. The same pulses can be seen on FIG. 3a, however, with a different time scale.

For the duration of the pulses the switch 2 is closed and connects the input terminal 1 with the capacitor 3. Before the switch 2 was closed, the voltage on the capacitor 3 was equal with the voltage that prevailed at the input terminal during the end of the previous pulse. This is due to the fact that by the end of the closed state of the switch 2 the capacitor 3 is charged to the voltage present at the input terminal 1. In case if this voltage has changed relative to the value taken during the last pulse, the capacitor 3 will be charged or discharged to this new voltage value, and its charging or discharging current will generate on the resistor 4 a decaying positive or negative voltage pulse.

Figure 3:
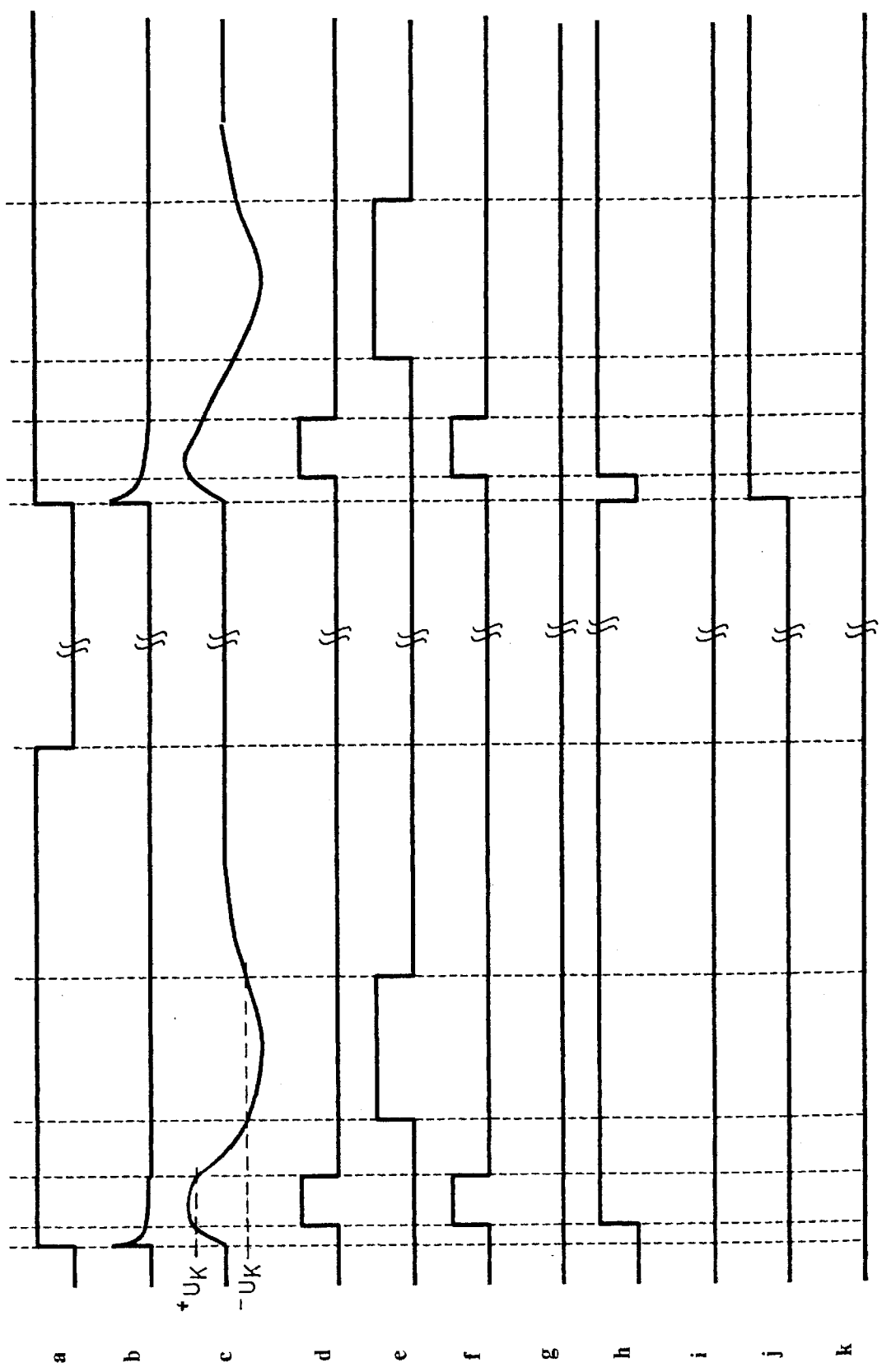
FIGS. 3a to 3k show the time diagrams of the signals that can be measured at a few number of characteristic places of the detection circuit.

If the voltage has increased since the last clock pulse, then the charging current transient will create an output signal that rises in positive direction then decays to zero. This output signal is shown on FIG. 3b. The charging process of the capacitor of the RC member in the feedback branch generates a transient pulse with an opposite sign, and the voltage of the output signal will be as shown in FIG. 3c. The DC average of this output signal will be zero. It is preferable if the time constants of the two subsequently occurring transients are chosen to be almost the same, since that makes the signal comprising the two half waves close to symmetric. The use of the second half wave is significant from the point of view of the long-term stability of the DC component of the output signal. The controlled amplifier 5 has an especially high input impedance, therefore the load represented thereby is negligibly low and it cannot change the voltage of the capacitor 3 within a sampling period.

In case if at the input terminal a decrease of voltage takes place relative to the previous state, then the capacitor 3 will be discharged to the new decreased level. Now the discharge current has an opposite sign with respect to the sign of the charging current at the previous case, thus a negative pulse appears on the resistance 4 with respect to the ground. At the output of the controlled amplifier 5 a full wave voltage pulse appears that starts with a negative half wave.

The duration of the sampling pulse shown on FIG. 2a is longer than the time constant of the RC member consisting of the capacitor 3 and the resistance 4, therefore by the end of the pulse the charging or discharging transient will have finished. When the switch 2 opens, the capacitor 3 will retain its voltage, and owing to its precision design this voltage will be accurately kept till the next pulse. The ratio of the period time and the sampling time is substantially higher than the one deducible from FIG. 2, which has a distorted scale.

As described, the change of the voltage of the input signal in a sampling period causes a voltage wave at the output of the controlled amplifier 5. Depending on the fact whether the input voltage has increased or decreased, this voltage wave starts with a positive or negative half wave. The width of the voltage window of the window comparator 7 is adjusted by the threshold voltages of comparison $+U_K$ and $-U_K$ to be substantially smaller than the amplitude of this wave. The comparation window should by symmetric to the output DC level of the controlled amplifier 5, and the symmetry can be adjusted by the potentiometer 12. FIG. 3c indicates that the positive. threshold of comparison $+U_K$ is crossed twice by the voltage lead to the signal input of the comparator 7 in the first half period of the full wave. In accordance with this fact the upper output of the comparator 7 associated with the upper (positive) crossing of the threshold a pulse shown in FIG. 3d will appear. In the second half period the voltage signal will cross twice the lower (negative) threshold of comparison $-U_K$, and at this time a pulse shown in FIG. 3e will appear at the lower comparator output associated with the lower threshold crossings.

The bistables 8a and 8b are reset by the leading 0–1 jump of the clock pulse, thus both of them will have a logical 1 value at their inverted outputs and zero value at the non-inverted outputs. The AND gates 13 and 14 are gated by the inverted output of the other one in the pair of bistables. At the beginning of the clock pulse the inverted output of both bistables 8a and 8b will be in 1 state, the writing into both bistables is possible. In the exemplary case the signal at the input terminal has changed, namely increased, which has a consequence that the wave starts with a positive half period. As a result of this a pulse will first appear at the upper output of the comparator 7 (FIG. 3d), and the value 1 will be written in the bistable 8a. FIG. 3f shows the state of the AND gate 13 and FIG. 3g shows the state of the AND gate 14. FIG. 3h shows the logical value of the bistable 8a, and FIG. 3i shows that of the bistable 8b. When at the output of the controlled amplifier 5 the voltage enters the second half period of the wave signal, and a pulse appears at the lower output of the comparator 7 (FIG. 3e.), no writing will be allowed in the bistable 8b. This is so because the inverted output of the other bistable 8a is in zero state that prohibits passage through the AND gate 14.

At the end of the sampling clock pulse the bistables 11a and 11b react to the rear edge of the pulse and store the momentary states of the other bistables 8a and 8b, and this will be retained till the end of the next period. The bistable 11a will store the "one" state (FIG. 3j) and the bistable 11b will store the "zero" state (FIG. 3k). From this principle it follows that a signal will appear at the output a if at the input terminal the voltage has increased relative to the value taken during the pervious sampling pulse. The output b will have a signal if the input voltage has decreased, finally, the output c will have a signal, if the input voltage has not changed, i.e. it has remained within the sensitivity threshold of the apparatus.

The rate of change of the voltage at the input terminal 1 has expedient significant at a wide range of applications. The sensitivity of the measurement of the rate of change can be adjusted within a wide range by means of changing the period time of the sampling pulses. In a given configuration the circuit has a predetermined sensitivity threshold. This can be e.g. 1 mV. If the period time of the sampling is chosen to 1 minute, then the sensitivity of the rate of change will be 1 mV/min, but in that case the data representing the new states will arrive in 1 minutes periodicity. If the task is constituted by the determination of the end of charge moment of a battery, and this condition is related to the fact when the earlier changing battery voltage gets stabilized or constant, then the sensitivity of 1 mV/min is very high. Such a condition can be applied at normal charging tasks. In case of quick chargers the charging current can be so high that the 1 minute interval will prove to be too long between two subsequent sensing, since an overcharging that can last till 1 minute might decrease the lifetime of the battery. In that case the sampling period should be shortened, whereby the sensitivity for the end of charge will be smaller, but at the same time the danger of overcharging the battery will practically be eliminated. The fact that the charging process will be finished at a level slightly below the fully charged state has no significance at fast chargers.

The solution according to the invention can thus decide with a high sensitivity and accuracy that the voltage at the input terminal has increased, decreased or has remained unchanged relative to an earlier value. This information has a particular significance in delivering an end of charge signal in case of charging batteries.

The circuit shown in FIG. 1 can determine the change of voltage signals only. In several fields of technique there are numerous tasks, in which the change of other characteristics like temperature or current has to be detected. In case if the examined parameter is a voltage or it can be converted to a voltage signal easily, as it is the case at sensing temperature values, the circuit shown in FIG. 1 can be used without any change. In case, however, if the examined characteristics is represented by the peak value of a pulsating signal sequence, the situation will not be easy anymore, because conventional ways of peak detection are associated with offset errors higher than the required sensitivity. Such a peak detection task can be found at such charging processes of batteries in which the change of the charging current should be detected or the moment should be known when the peak values have stabilized.

The charging current is constituted by a pulsating direct current, wherein the pulsation can be converted to a voltage pulse sequence by means of a conventional current-to-voltage converter.

Figure 4:
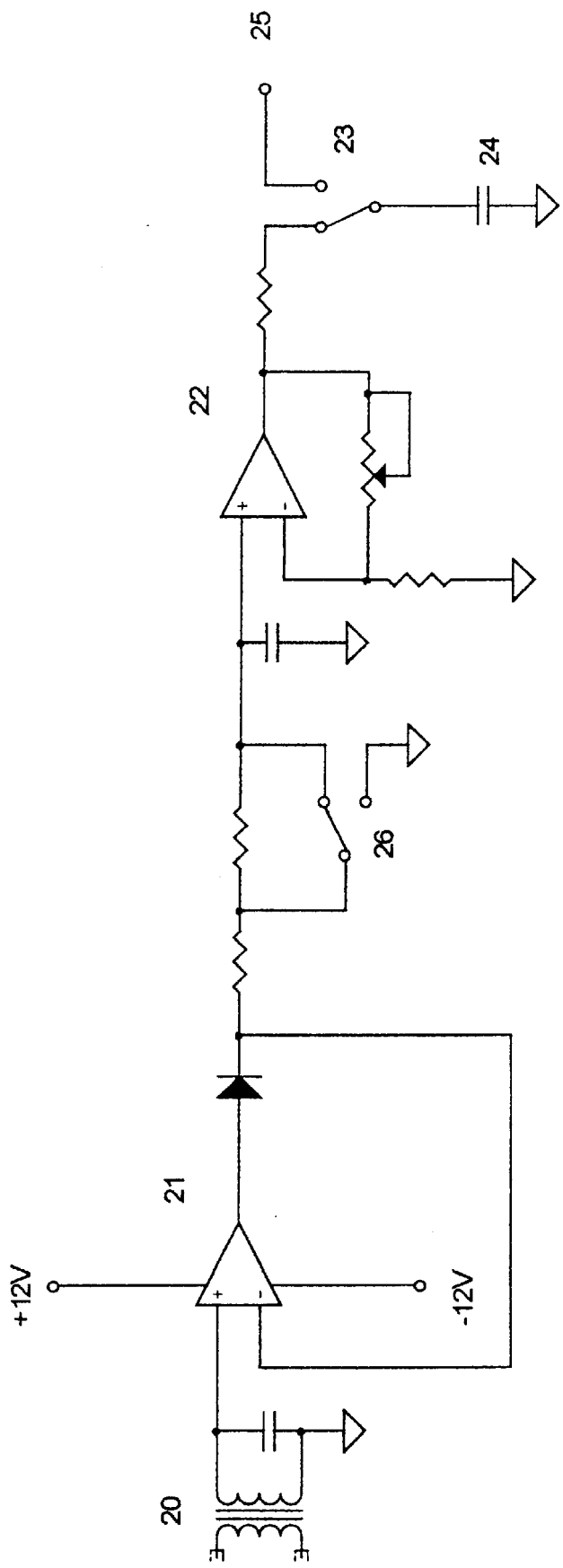
FIG. 4 is the circuit diagram of a current detector.

FIG. 4 shows a circuit capable of generating a direct current voltage representing the peak value of a pulsating current signal that has been converted first into an alternating current. The detection of the change of this direct current voltage can be solved by the circuit of FIG. 1.

The input of the circuit is constituted by the secondary winding of a current converter 20, which has a grounded terminal and another terminal connected through an integrating filter to active peak detector 21, that comprises an operational amplifier and a diode. The output of the peak detector 21 is coupled through an RC filter to a amplifier 21 having a feedback loop comprising a feedback resistor by which the gain can be adjusted. The output of the amplifier 22 is coupled through a controlled switch 23 and to a capacitor 24 and to output terminal 25 of the circuit. Between a branch of the second filter and the ground a second controlled switch 26 is provided.

The operation of the circuit is as follows.

From the alternating voltage proportional to the current to be examined, following a smoothing that eliminates any high frequency noise, the active peak detector 21 generates a pulsating direct current voltage. Here the DC component of the level between the pulses will be zero, i.e. the rectified direct current voltage will not be superimposed on the forward voltage of the diode. The pulses of the pulse generator 9 shown in FIG. 1 operate the switches 23 and 26 and this takes place in synchrony with the switch 2. During the long interval preceding each sampling pulse the switches 23, 26 are in the position shown in FIG. 4, i.e. the second filter is coupled to the input of the amplifier 22, and the output of the amplifier 22 is coupled to the capacitor 24.

The pulsating DC voltage charges the capacitor in the second filter to the peak value, which appears at the output of the amplifier 22 so that the source impedance will be low, and the capacitor 24 will be charged soon to this value.

During the short sampling period that follows the long interval the states of the switches 24 and 26 will be reversed, the capacitor 24 will be coupled to the output terminal 25 and its voltage truly preserves the earlier level representing the voltage to be detected. The circuit shown in FIG. 1 will sense the changes of this level as described earlier.

The switch 26 connects the input of the amplifier 22 and the capacitor in the second filter to the ground. As a result of this the circuit will start in the next period from the zero level. In the next long period this process will be repeated and the capacitor 24 will be charged again to the peak of the alternating voltage. The advantage of the circuit is that the output signal will be a direct current voltage that depends very accurately only on the peak value of the input pulses, and this direct current voltage will not be loaded by any superimposed noise or alien component. The high accuracy is the consequence of the standard zero state provided during the sampling periods.

I claim:

1. Apparatus for detecting slow and small changes of electrical signals including the sign of the changes, comprising:
   a controlled switch (2) connected in the path of the signal to be detected;
   a capacitor (3) connected with a first terminal to the switch and charged to the voltage of said signal;
   an amplifier (5) with an input connected to second terminal of the capacitor (3) and generating a pulse signal corresponding to the charge or discharge current of the capacitor having corresponding proper sign;
   a window comparator (7) having first and second reference voltages ($+U_K$, $-U_K$) determining a window, and a signal input connected to output of the amplifier (5) for indicating whether the output signal of the amplifier lies in the range defined by the window or it has been crossed in negative or positive directions;
   storage and logical units each having first and second storage means (8, 11); and
   a pulse generator (9) connected to control input of the controlled switch (2) to make it closed for periodically repeated sampling periods, and also connected to the storage and logical units,
   wherein said first storage means storing the logical state of the window comparator (7) taken during said pulse signal with proper sign, and a predetermined section of each pulse of said pulse generator reading such stored values of said first storage means into said second storage means.

2. The apparatus as claimed in claim 1, wherein said pulse generator (9) has pulses with variable period time.

3. The apparatus as claimed in claim 1, wherein the amplifier (5) comprises RC feedback elements complementing each of said charging or discharging pulse with a respective pulse of opposite sign, and the time of these pulses being in the same order of magnitude.

4. The apparatus as claimed in claim 1, wherein the voltage window of said window comparator (7) being adjustable to be symmetric relative to the base level of the output signal of the amplifier (5).

5. The apparatus as claimed in claim 1, wherein said first storage means being a pair of bistables (8a, 8b), having inputs gated by the inverted output of the other one in the pair, furthermore said bistables being reset by the leading edges of the sampling pulses of the pulse generator (9).

6. The apparatus as claimed in claim 1, wherein said second storage means being a pair of bistables (11a, 11b), and the storage therein occurring under the effect of the rear edges of said sampling pulses of the pulse generator (9).

7. A method for detecting slow and small changes of electrical signals including the sign of the changes, comprising the steps of switching the signal to be detected periodically to a capacitor (3) and changing thereby its charge state taken in the previous period, examining the extent and sign of a decaying current pulse caused when said capacitor (3) has been forced to take the new charge state, if the extent of this decaying current pulse is higher than a predetermined threshold limit, storing this fact and the sign of the change till the next period, characterized by the steps of generating a single alternating wave in response to every change in the charge state of said capacitor (3) so that the DC average of the alternating wave is zero and the amplitude of first half wave being proportional to said decaying current pulse, in said examining step examining directly said first half wave of said alternating wave as a signal representing said decaying current pulse, wherein the duration of said switching step being longer than the period time of said single alternating wave, which itself being longer than said decaying current pulse.

8. The method as claimed in claim 7, wherein depending on the accuracy how the steepness of the changes of the electrical signal should be determined, the time elapsed between subsequent sampling periods being adjusted, wherein said adjustment being unrelated to the transient processes that take place during said switching step.

9. The method as claimed in claim 7, wherein the signal to be examined being the voltage of a battery when being charged.

* * * * *